United States Patent
Chang et al.

(10) Patent No.: US 10,727,286 B2
(45) Date of Patent: Jul. 28, 2020

(54) PIXEL STRUCTURE AND DISPLAY PANEL

(71) Applicant: Au Optronics Corporation, Hsinchu (TW)

(72) Inventors: Che-Chia Chang, Hsinchu (TW); Ming-Hung Chuang, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 90 days.

(21) Appl. No.: 15/956,769

(22) Filed: Apr. 19, 2018

(65) Prior Publication Data
US 2019/0198585 A1   Jun. 27, 2019

(51) Int. Cl.
| | |
|---|---|
| *H01L 27/32* | (2006.01) |
| *G09G 3/32* | (2016.01) |
| *H01L 27/14* | (2006.01) |
| *H01L 27/15* | (2006.01) |
| *G09G 3/3225* | (2016.01) |

(52) U.S. Cl.
CPC ............ *H01L 27/3246* (2013.01); *G09G 3/32* (2013.01); *G09G 3/3225* (2013.01); *H01L 27/14* (2013.01); *H01L 27/156* (2013.01); *G02F 2201/123* (2013.01); *G09G 2300/0426* (2013.01); *G09G 2360/142* (2013.01); *G09G 2360/144* (2013.01)

(58) Field of Classification Search
CPC ... H01L 27/3246; H01L 27/14; H01L 27/156; G09G 3/32; G09G 3/3225; G09G 2300/0426; G09G 2360/142; G09G 2360/144; G02F 2201/123
See application file for complete search history.

(56) References Cited

U.S. PATENT DOCUMENTS

| | | | |
|---|---|---|---|
| 6,341,003 B1 * | 1/2002 | Ashizawa | ......... G02F 1/134363 349/125 |
| 7,683,309 B1 | 3/2010 | Chen et al. | |
| 8,772,075 B2 | 7/2014 | Cho et al. | |
| 9,159,700 B2 | 10/2015 | Sakariya et al. | |
| 9,620,571 B2 | 4/2017 | Shedletsky et al. | |
| 2006/0038752 A1 * | 2/2006 | Winters | ............... G09G 3/3225 345/76 |

(Continued)

FOREIGN PATENT DOCUMENTS

| | | |
|---|---|---|
| CN | 101635276 | 1/2010 |
| TW | 201106231 | 2/2011 |

*Primary Examiner* — Sejoon Ahn
(74) *Attorney, Agent, or Firm* — JCIPRNET

(57) ABSTRACT

A pixel structure disposed on a substrate having a pixel sensor region and a pixel display region disposed beside the pixel sensor region is provided. The pixel structure includes a pixel defining layer, a light-emitting diode, a pixel driving circuit and a sensor device. The pixel defining layer is disposed on the substrate and has a device accommodation portion located in the pixel display region. The light-emitting diode is disposed on the device accommodation portion. The area of the light-emitting diode is smaller than that of the device accommodation portion. The pixel driving circuit is disposed on the substrate, is electrically connected to the light-emitting diode, and includes a pixel electrode by which the device accommodation portion is covered. The light-emitting diode is bonded onto the pixel electrode. The sensor device is disposed between the pixel defining layer and the substrate and located in the pixel sensor region.

18 Claims, 5 Drawing Sheets

(56) References Cited

U.S. PATENT DOCUMENTS

| | | | |
|---|---|---|---|
| 2006/0061269 A1* | 3/2006 | Tsuchiya | H01L 27/3276 |
| | | | 313/506 |
| 2008/0111467 A1* | 5/2008 | Yokota | H01J 29/28 |
| | | | 313/495 |
| 2010/0007632 A1* | 1/2010 | Yamazaki | H01L 27/3234 |
| | | | 345/175 |
| 2010/0327289 A1 | 12/2010 | Cho et al. | |
| 2011/0037729 A1 | 2/2011 | Cho et al. | |
| 2011/0148835 A1 | 6/2011 | Yamazaki | |
| 2014/0354617 A1 | 12/2014 | Nam et al. | |
| 2017/0032167 A1 | 2/2017 | Chen et al. | |
| 2017/0194402 A1* | 7/2017 | Choi | H01L 27/3211 |
| 2017/0242549 A1 | 8/2017 | Lim et al. | |
| 2017/0269749 A1 | 9/2017 | Bok et al. | |
| 2017/0308194 A1* | 10/2017 | Guard | G06F 3/044 |
| 2018/0145118 A1* | 5/2018 | Kim | G09G 3/3258 |

* cited by examiner

PIXEL STRUCTURE AND DISPLAY PANEL

CROSS-REFERENCE TO RELATED APPLICATION

This application claims the priority benefit of Taiwan application serial no. 106145143, filed on Dec. 21, 2017. The entirety of the above-mentioned patent application is hereby incorporated by reference herein and made a part of this specification.

BACKGROUND OF THE INVENTION

Field of the Invention

The invention relates to a pixel structure and a display panel, and particularly relates to a pixel structure having a sensor device and a display panel.

Description of Related Art

Smartphones, smart watches, tablet computers or other electronic devices are often set with sensor devices to be applied to the extended functions of electronic devices. For example, an electronic device may be set with an ambient light sensor (ALS), so that the brightness of the device screen may be promptly adjusted according to changes in surrounding ambient light sources. Alternatively, one may set a fingerprint sensor device as a vouch for protecting information security of electronic devices. The current trend is to set the sensor device directly in the display region of the display panel, so that the sensor device may be set without occupying an extra region of the electronic device.

However, for current display panels (such as liquid crystal panels or organic light-emitting diode panels), setting the sensor device in the pixel structure further will compress the size of the original display region in the pixel structure, for example, the aperture ratio of the liquid crystal panel or the light-emitting area of the organic light-emitting diode in the organic light-emitting diode panel, thereby affecting the luminous efficiency of the display panel.

SUMMARY OF THE INVENTION

The invention provides a pixel structure which includes a sensor device and a light-emitting diode still having ideal luminous efficiency.

The invention provides a display panel including the aforementioned pixel structure, wherein the luminous efficiency of the light-emitting diode is less affected by the size of the pixel display region.

The pixel structure of the invention is disposed on a substrate having a pixel sensor region and a pixel display region disposed beside the pixel sensor region. The pixel structure includes a pixel defining layer, a light-emitting diode, a pixel driving circuit and a sensor device. The pixel defining layer is disposed on the substrate, wherein the pixel defining layer has a device accommodation portion located in the pixel display region. The light-emitting diode is disposed on the device accommodation portion, wherein an area of the light-emitting diode is smaller than that of the device accommodation portion. The pixel driving circuit is disposed on the substrate and is electrically connected to the light-emitting diode, wherein the pixel driving circuit includes a pixel electrode covering the device accommodation portion and the light-emitting diode is bonded onto the pixel electrode. The sensor device is disposed between the pixel defining layer and the substrate, and the sensor device is located in the pixel sensor region.

According to an exemplary embodiment of the invention, the aforementioned pixel driving circuit further includes a pixel active device disposed between the pixel electrode and the substrate and being electrically connected to the pixel electrode.

According to an exemplary embodiment of the invention, the aforementioned pixel structure further includes a protective layer covering the pixel electrode and the device accommodation portion and surrounding the light-emitting diode.

According to an exemplary embodiment of the invention, the aforementioned pixel structure further includes a counter electrode electrically connected to the light-emitting diode, wherein the counter electrode and the pixel electrode are connected to opposite sides of the light-emitting diode and are isolated from each other by a protective layer According to an exemplary embodiment of the invention, the aforementioned counter electrode has an opening located in the pixel sensor region.

According to an exemplary embodiment of the invention, the aforementioned sensor device includes a first conductive layer, a silicon-rich material layer and a second conductive layer that are stacked in sequence.

According to an exemplary embodiment of the invention, the aforementioned pixel structure further includes a compensation circuit structure electrically connected to the pixel driving circuit and located in the pixel sensor region, wherein the compensation circuit structure is located between the silicon-rich material layer and the substrate.

According to an exemplary embodiment of the invention, the aforementioned sensor device further includes a sensing driving circuit electrically connected to the first conductive layer.

According to an exemplary embodiment of the invention, the aforementioned sensing driving circuit includes a sensor active device located in the pixel sensor region and including a semiconductor layer and a gate. The semiconductor layer has a channel region and two source/drain regions located on both sides of the channel region, and the channel region is located between the gate and the substrate.

According to an exemplary embodiment of the invention, the aforementioned pixel driving circuit further includes a pixel active device located in the pixel display region and including a semiconductor layer and a gate. The semiconductor layer has a channel region and two source/drain regions located on both sides of the channel region, and the channel region is located between the gate and the substrate, wherein the channel region of the pixel active device and the channel device of the sensor active device are a same film layer, and the gate of the pixel active device and the gate of the sensor active device are a same film layer.

According to an exemplary embodiment of the invention, the aforementioned pixel structure further includes an insulating interlayer disposed between the substrate and the pixel defining layer, wherein the pixel driving circuit further includes a pixel active device and a conductive connecting layer. The pixel active device is located between the insulating interlayer and the substrate. The conductive connecting layer is disposed on the insulating interlayer to connect between the pixel active device and the pixel electrode, and the conductive connecting layer and the first conductive layer of the sensor device are a same film layer.

According to an exemplary embodiment of the invention, the aforementioned pixel electrode and the second conductive layer of the sensor device are a same film layer.

According to an exemplary embodiment of the invention, the aforementioned light-emitting diode includes a first semiconductor layer, an inorganic light-emitting layer and a second semiconductor layer that are stacked in sequence.

According to an exemplary embodiment of the invention, the aforementioned light-emitting diode is bonded onto the pixel electrode of the pixel driving circuit by a conductive bonding layer.

According to an exemplary embodiment of the invention, a ratio of a width of the aforementioned light-emitting diode to a width of the device accommodation portion is smaller than or equal to 1, and greater than or equal to 0.01.

A display panel of the invention has a first sensor region and a second sensor region. The display panel includes a plurality of pixel structures disposed in the first sensor region and the second sensor region. Each of the pixel structure includes a light-emitting diode and a sensor device, wherein the sensor device of the pixel structure located in the first sensor region performs a first sensing mode, the sensor device of the pixel structure located in the second sensor region performs a second sensing mode, and the first sensing mode and the second sensing mode sense different parameters.

According to an exemplary embodiment of the invention, the aforementioned first sensing mode performs one of fingerprint recognition, visible light sensing, ultraviolet light sensing and infrared light sensing, and the second sensing mode performs another.

According to an embodiment of the invention, the aforementioned first sensor region and the second sensor region do not overlap each other.

According to an exemplary embodiment of the invention, each of the aforementioned pixel structures is disposed on the substrate, the substrate has a pixel sensor region and a pixel display region beside the pixel sensor region, and each of the pixel structures further includes a pixel defining layer and a pixel driving circuit. The pixel defining layer is disposed on the substrate, wherein the pixel defining layer has a device accommodation portion located in the pixel display region. The pixel driving circuit is disposed on the substrate and is electrically connected a light-emitting diode, wherein the pixel driving circuit includes a pixel electrode covering the device accommodation portion, wherein the light-emitting diode is disposed on the device accommodation portion and is bonded onto the pixel electrode. An area of the light-emitting diode is smaller than that of the device accommodation portion. The sensor device is disposed between the pixel defining layer and the substrate, and the sensor device is located in the pixel sensor region.

According to an exemplary embodiment of the invention, the aforementioned sensor device includes a first conductive layer, a silicon-rich material layer and a second conductive layer that are stacked in sequence.

Based on the foregoing, the pixel structure of the invention includes the pixel defining layer, the light-emitting diode, the pixel driving circuit and the sensor device. The light-emitting diode is disposed on the device accommodation portion of the pixel defining layer, wherein the area of the light-emitting diode is smaller than that of the device accommodation portion. In other words, the required area occupied by the light-emitting diode is smaller. Therefore, even if the sensor device is set in the pixel structure and therefore compresses the size of the pixel display region, the luminous efficiency of the pixel structure is also less affected. Since the display panel of the invention includes the aforementioned pixel structure, the luminous efficiency thereof is also less affected by the size of the pixel display region.

To make the above features and advantages of the invention more comprehensible, embodiments accompanied with drawings are described in detail as follows.

DETAILED DESCRIPTION OF DISCLOSED EMBODIMENTS

Figure 1:
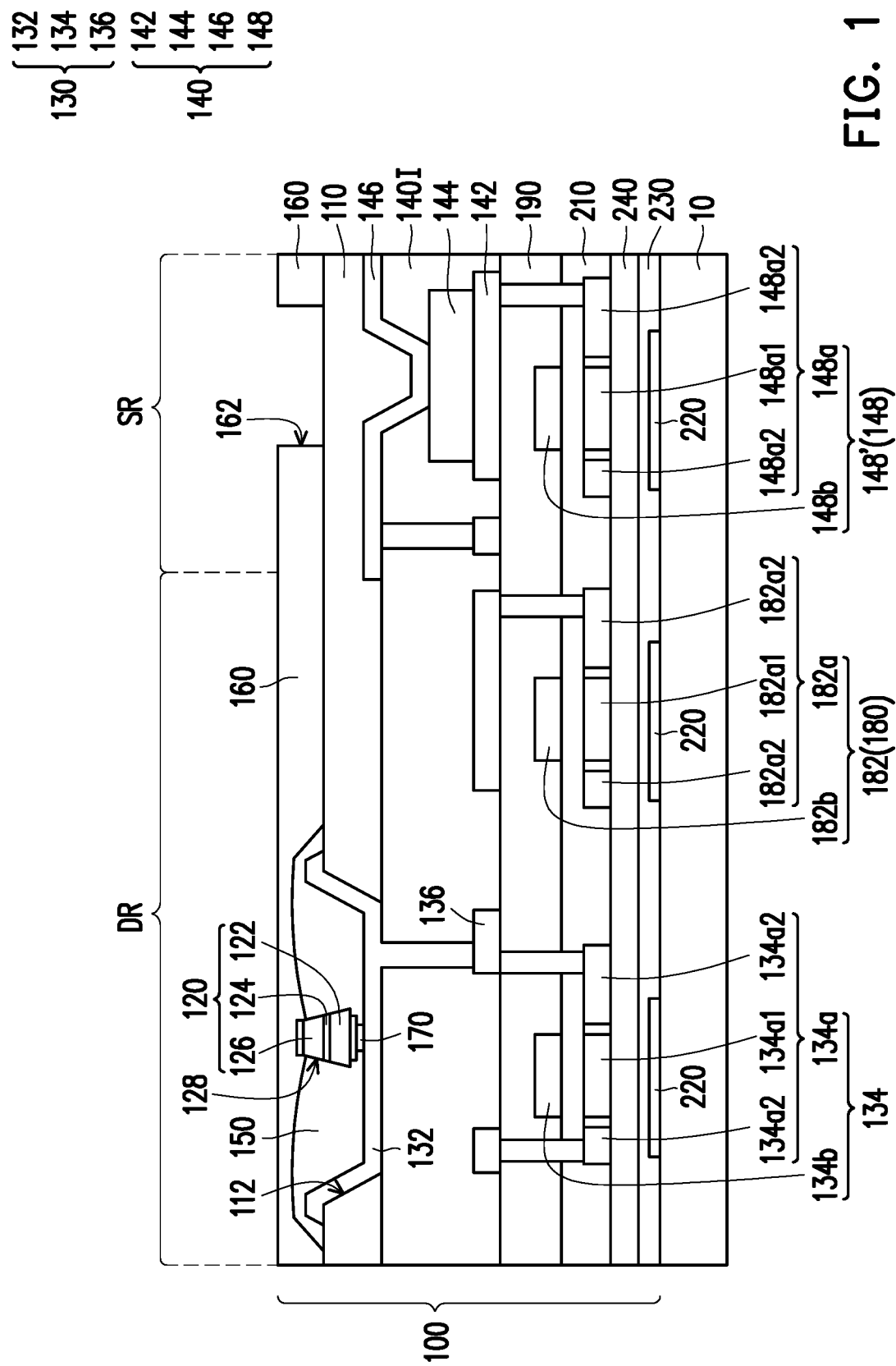
FIG. 1 is a schematic cross-sectional view of a pixel structure according to a first exemplary embodiment of the invention.
Figure 2:
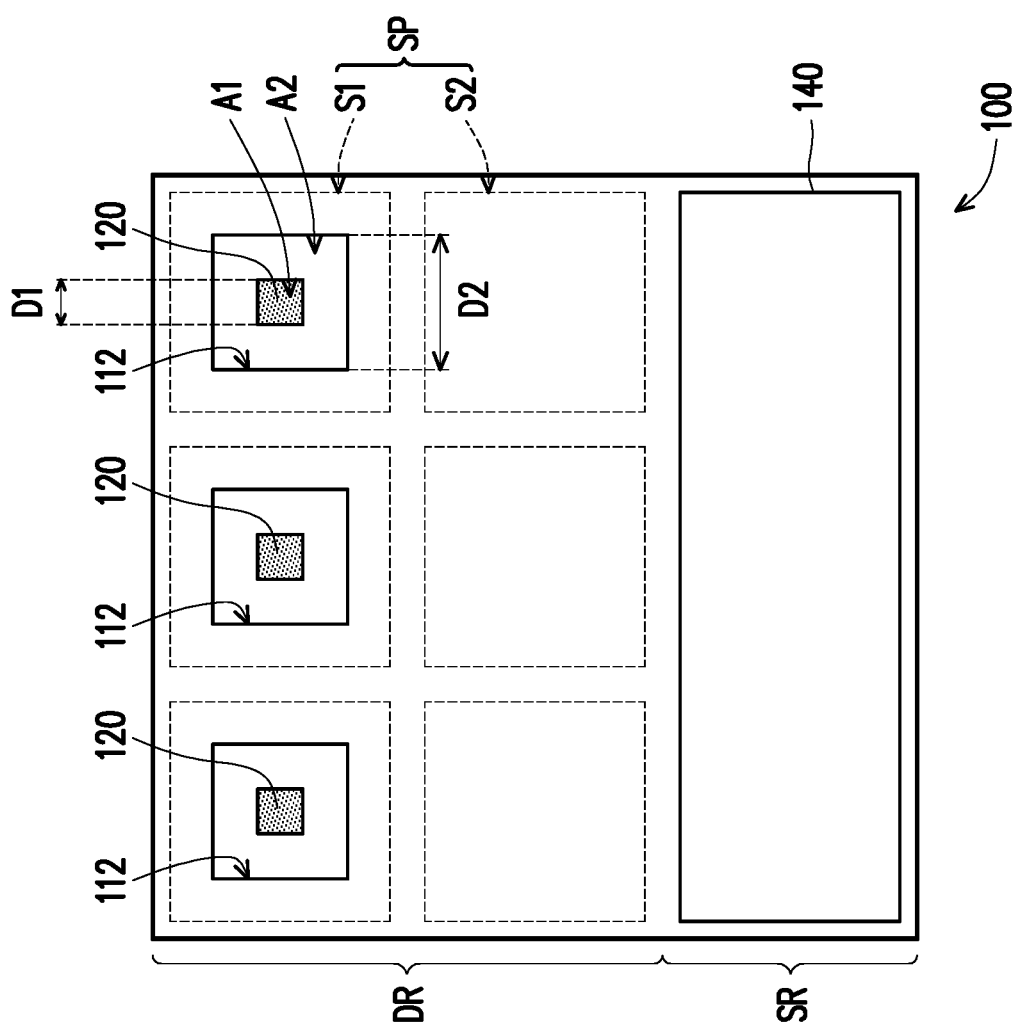
FIG. 2 is a schematic top view of the pixel structure of FIG. 1.

FIG. 1 is a schematic cross-sectional view of a pixel structure according to a first exemplary embodiment of the invention. FIG. 2 is a schematic top view of the pixel structure of FIG. 1. Referring to FIG. 1 and FIG. 2, a pixel structure 100 is disposed on a substrate 10, the substrate 10 has a pixel sensor region SR and a pixel display region DR beside the pixel sensor region SR, and the pixel structure 100 includes a pixel defining layer 110, a light-emitting diode 120, a pixel driving circuit 130 and a sensor device 140. The pixel defining layer 110 is disposed on the substrate 10, wherein the pixel defining layer 110 has a device accommodation portion 112, and the device accommodation portion 112 is located in the pixel display region DR. The light-emitting diode 120 is disposed on the device accommodation portion 112, wherein an area A1 (marked in FIG. 2) occupied by the light-emitting diode 120 is smaller than an area A2 (marked in FIG. 2) surrounded by the device accommodation portion 112. In the exemplary embodiment, a ratio of a width D1 (marked in FIG. 2) of the light-emitting diode 120 to a width D2 (marked in FIG. 2) of the device accommodation portion 112, for example, is smaller than or equal to 1, and greater than or equal to 0.01, but the invention is not limited thereto.

In the exemplary embodiment, the light-emitting diode 120, for example, is a micro light-emitting diode (μLED) with a micrometer-scale size. For example, a length of a diagonal of the light-emitting diode 120 of the exemplary embodiment, for example, is greater than or equal to 1 micrometer and lesser than or equal to 100 micrometers, but is not limited thereto. In other exemplary embodiment, the light-emitting diode 120 may also have a smaller or larger size. In the exemplary embodiment, since the luminous efficiency of the micro light-emitting diode is very high and an area occupied by the micro light-emitting diode is smaller, even if the sensor device 140 is set in the pixel structure 100 and therefore compresses the size of the pixel display region DR, the luminous efficiency of the pixel structure 100 is also less affected.

In the exemplary embodiment, the light-emitting diode 120 includes a first semiconductor layer 122, an inorganic light-emitting layer 124, and a second semiconductor layer 126 that are stacked in sequence from bottom to top. The first semiconductor layer 122, for example, is a P-type doped semiconductor layer and the second semiconductor layer 126, for example, is an N-type doped semiconductor layer. Alternatively, the first semiconductor layer 122, for example, is an N-type doped semiconductor layer, and the second semiconductor layer 126, for example, is a P-type doped semiconductor layer. The structure of the inorganic light-emitting layer 124, for example, is a multiple quantum well (MQW) structure which includes a plurality of quantum well layers and a plurality of quantum barrier layers set alternately in a repetitive manner. To provide an example, a material of the P-type doped semiconductor layer, for example, is P-type gallium nitride (p-GaN), a material of the N-type doped semiconductor layer, for example, is N-type gallium nitride (n-GaN), a material of the multiple quantum well structure, for example, includes multiple layers of alternately stacked indium gallium nitride (InGaN) and gallium nitride (GaN), but the invention is not limited thereto.

Here, the light-emitting diode 120, for example, has an inclined side wall 128, and the side wall 128, for example, is extended outward from the top of the light-emitting diode 120 to the bottom of the light-emitting diode 120. In other exemplary embodiment (not shown), the side wall 128 of the light-emitting diode 120 may extend inward from the top of the light-emitting diode 120 to the bottom of the light-emitting diode 120, or the light-emitting diode 120 may has a vertical side wall 128, but the invention is not limited thereto.

Referring to FIG. 1 again, the pixel driving circuit 130 is disposed on the substrate 10 and is electrically connected to the light-emitting diode 120, wherein the pixel driving circuit 130 includes a pixel electrode 132, the pixel electrode 132 covers the device accommodation portion 112 and the light-emitting diode 120 is bonded onto the pixel electrode 132. The pixel structure 100 may further include a protective layer 150 and a counter electrode 160. The protective layer 150 covers the pixel electrode 132 and the device accommodation portion 112, and surrounds the light-emitting diode 120. The counter electrode 160 is electrically connected to the light-emitting diode 120, wherein the counter electrode 160 and the pixel electrode 132 are connected to two opposite sides of the light-emitting diode 120 and are isolated from each other by the protective layer 150. In the exemplary embodiment, the light-emitting diode 120, for example, is bonded onto the pixel electrode 132 of the pixel driving circuit 130 by a conductive bonding layer 170. The conductive bonding layer 170, for example, is a conductive bump, and the material thereof, for example, is selected from indium (In), tin (Sn) or an alloy thereof (In/Sn), but the invention is not limited thereto. The width of the conductive bonding layer 170, for example, is smaller than the width of the bottom of the light-emitting diode 120, so that when the conductive bonding layer 170 is performed the reflow step, the molten conductive bonding layer 170 is less likely to overflow to the side wall 128 of the light-emitting device 120 and be in contact with the inorganic light-emitting layer 124 of the light-emitting diode 120, so as to avoid a short circuit situation.

The sensor device 140 is disposed between the pixel defining layer 110 and the substrate 10, and the sensor device 140 is located in the pixel sensor region SR. In the exemplary embodiment, the sensor device 140 includes a first conductive layer 142, a silicon-rich material layer 144 and a second conductive layer 146 that are stacked in sequence from bottom to top, wherein the first conductive layer 142 and the silicon-rich material layer 144 is further covered by an insulating layer 1401. The insulating layer 1401 is located between the first conductive layer 142 and the second conductive layer 146, and has an opening exposing the silicon-rich material layer 144, and the second conductive layer 146 is connected to the silicon-rich material layer 144 through the opening of the insulating layer 1401. Here, when the stoichiometry of silicon in the material is greater than 1, the material is defined as a silicon-rich material. In the exemplary embodiment, the first conductive layer 142, for example, is a metal conductive layer. To provide an example, the first conductive layer 142, for example, includes a titanium/aluminum/titanium (Ti/Al/Ti) layer, but is not limited thereto. In other exemplary embodiment, the second conductive layer 146 may be a transparent conductive layer, and the material thereof, for example, is indium tin oxide (ITO), indium zinc oxide (IZO) or aluminum zinc oxide (AZO), but is not limited thereto. The material of the silicon-rich material layer 144, for example, is silicon-rich silicon oxide ($SiO_x$), silicon-rich silicon nitride ($SiN_y$), silicon-rich silicon oxynitride ($SiO_xN_y$), silicon-rich silicon carbide ($SiC_w$), silicon-rich silicon oxycarbide ($SiC_wO_x$) or the combination thereof, wherein $0.01<x<2$, $0.01<y<1.67$, and $0.01<w<1$, but is not limited thereto. In other exemplary embodiment, the material of the silicon-rich material layer 144 may be hydrogenated silicon-rich silicon oxide ($SiO_xH_z$), hydrogenated silicon-rich silicon nitride ($SiN_yH_z$), hydrogenated silicon-rich silicon oxynitride ($SiO_xN_yH_z$), hydrogenated silicon-rich silicon oxycarbide ($SiC_wO_xH_z$) or the combination thereof, wherein $0.01<x<2$, $0.01<y<1.67$, $0.01<z<1$, and $0.01<w<1$, but is not limited thereto. The second conductive layer 146, for example, is a transparent conductive layer, and the material thereof, for example, is ITO, IZO or AZO, but is not limited thereto.

When a light source irradiates the silicon-rich material layer 144 of the sensor device 140, the silicon-rich material layer 144 is excited to produce electron-hole pairs. The electron-hole pairs are separated after being subjected to the electric field between the first conductive layer 142 and the second conductive layer 146 to form and output a photocurrent. Therefore, the sensor device 140 of the exemplary embodiment may serve as an ALS, which is, for example, applied to one of fingerprint recognition, visible light sensing, ultraviolet light sensing and infrared light sensing, but the invention is not limited thereto. Here, the counter electrode 160 may have an opening 162 located in the pixel sensor region SR and disposed above the silicon-rich material layer 144. By the setting of the opening 162, a part of the wavelength of the light source may be avoided from being absorbed by the material located above the silicon-rich material layer 14 before being incident on the silicon-rich material layer 144. Therefore, the sensor device 140 may receive light in a more complete wavelength range, so that the application of the sensor device 140 may be more diversified.

In addition, in other exemplary embodiment (not shown), the sensor device may further include an interface layer set between the first conductive layer 142 and the silicon-rich material layer 144. The interface layer may be formed in different manners, for example, formed by the manner of performing a plasma surface treatment using a plasma gas to the first conductive layer 142, and the aforementioned plasma gas, for example, is oxygen, nitrogen, nitrous oxide, or the combination thereof. Therefore, the material of the interface layer, for example, is oxide, nitride, nitrogen oxide, or the combination thereof, but is not limited thereto. To provide an example, taking the surface of the first conductive layer 142 being titanium as an example, the material of the interface layer may be titanium oxide, titanium nitride, titanium oxynitride, or the combination thereof, but is not limited thereto. Here, the sensor device having the interface layer has a rather strong linear relationship between the photocurrent and the light intensity thereof, which is favorable for the accuracy of the sensor device.

In the exemplary embodiment, the sensor device 140 further includes a sensing driving circuit 148 disposed on the substrate 10 and electrically connected to the first conductive layer 142. The sensing driving circuit 148 includes a sensor active device 148' disposed between the silicon-rich material layer 144 and the substrate 10 and electrically connected to the silicon-rich material layer 144. The sensor active device 148' is located in the pixel sensor region SR and includes a semiconductor layer 148a and a gate 148b. The semi-conductor layer 148a has a channel region 148a1 and two source/drain regions 148a2 located on both sides of the channel region 148a1, and the channel region 148a1 is located between the gate 148b and the substrate 10.

The pixel driving circuit 130 further includes a pixel active device 134 disposed between the pixel electrode 132 and the substrate 10 and electrically connected to the pixel electrode 132. The pixel active device 134 is located in the pixel display region DR and includes a semiconductor layer 134a and a gate 134b. The semiconductor layer 134a has a channel region 134a1 and two source/drain regions 134a2 located on both sides of the channel region 134a1, and the channel region 134a1 is located between the gate 134b and the substrate 10.

In the exemplary embodiment, the pixel structure 100 further includes a compensation circuit structure 180 and an insulating interlayer 190. The compensation circuit structure 180 is disposed between the insulating interlayer 190 and the substrate 10, and electrically connected to the pixel driving circuit 130. The insulating interlayer 190 is disposed between the substrate 10 and the pixel defining layer 110. The compensation circuit structure 180 is located in the pixel display region DR and located between the pixel driving circuit 130 and the sensing driving circuit 148. The compensation circuit structure 180 includes a compensation device 182 and a conductive connecting layer 184. The compensation device 182 includes a semiconductor layer 182a and a gate 182b. The semiconductor layer 182a has a channel region 182a1 and two source/drain regions 182a2 located on both sides of the channel region 182a1, and the channel region 182a1 is located between the gate 182b and the substrate 10. The conductive connecting layer 184 is disposed on the insulating interlayer 190 to electrically connect between the compensation circuit structure 180 and the pixel driving circuit 130. In the exemplary embodiment, the pixel driving circuit 130 further includes a conductive connecting layer 136. The conductive connecting layer 136 is disposed on the insulating interlayer 190 to connect between the pixel active device 134 and the pixel electrode 132, and the pixel active device 134 is located between the insulating interlayer 190 and the substrate 10.

In the exemplary embodiment, the conductive connecting layer 136 of the pixel driving circuit 130, the conductive connecting layer 184 of the compensation circuit structure 180 and the first conductive layer 142 of the sensor device 140 may be a same film layer, and the conductive connecting layer 136 of the pixel driving circuit 130, the conductive connecting layer 184 of the compensation circuit structure 180 and the first conductive layer 142 of the sensor device 140 are formed individually after a patterning process. In addition, the channel region 134a1 of the pixel active device 134, the channel region 148a1 of the sensor active device 148' and the channel region 182a1 of the compensation device 182 may also be a same film layer, and the channel region 134a1 of the pixel active device 134, the channel region 148a1 of the sensor active device 148' and the channel region 182a1 of the compensation device 182 are formed individually after a patterning process. Similarly, the gate 134b of the pixel active device 134, the gate 148b of the sensor active device 148' and the gate 182b of the compensation device 182 may also be a same film layer, and the gate 134b of the pixel active device 134, the gate 148b of the sensor active device 148' and the gate 182b of the compensation device 182 are formed individually after a patterning process. In addition, the pixel active device 134, the sensor active device 148' and the compensation device 182 may also share a same gate dielectric layer 210. The gate dielectric layer 210 is disposed between the gate 148b and the channel region 148a1 of the sensor active device 148', is disposed between the gate 134b and the channel region 134a1 of the pixel active device 134, and is disposed between the gate 182b and the channel region 182a1 of the compensation device 182.

In the exemplary embodiment, the pixel structure 100 may further include an opaque layer 220, a first buffer layer 230 and a second buffer layer 240 that are stacked in sequence on the substrate 10 from bottom to top. The opaque layer 220 may prevent light from being incident on the pixel structure 100 from one side of the substrate 10 and affecting the pixel driving circuit 130, the compensation circuit structure 180 and the sensor device 140 located above. Specially, an area of the opaque layer 220 corresponds to the channel region 134a1 of the active device 134, the channel region 148a1 of the sensor active device 148', and the channel region 182a1 of the compensation device 182, helping to avoid leakage currents of these channel regions due to illumination from the external light.

Referring to FIG. 2 again, each light-emitting diode 120 and the driving circuit thereof may form a sub-pixel SP, and the pixel structure 100 may have a plurality of sub-pixels SP (FIG. 2 is an example of the three sub-pixels SP. In other exemplary embodiment, the number of the sub-pixels SP may be two, four, or other numbers). Each sub-pixel SP includes one light-emitting diode 120 and a related circuit for driving the light-emitting diode 120. The plurality of the sub-pixels SP are located in the pixel display region DR and each of the sub-pixels SP may further be divided into a display device disposition region S1 (a disposition region of the light-emitting diode 120) and a compensation circuit disposition region S2 (a disposition region of the compensation circuit structure 180). The pixel sensor region SR for disposing the sensor device 140 corresponds to the three sub-pixels SP. Therefore, in the pixel structure 100 of the exemplary embodiment, the number of sensor devices 140 is not equal to the number of the sub-pixels SP (or the light-emitting diodes 120), and the number of the sensor devices 140 is smaller than the number of the sub-pixels SP (or the light-emitting diodes 120), but is not limited thereto.

To describe in detail, to form a pixel structure 100 having the sensor device 140, it is necessary to set the display device disposition region S1, the compensation circuit disposition region S2 and the pixel sensor region SR at the same time. Therefore, an area occupied by the display device disposition region S1 is compressed. However, since the light-emitting diode 120 of the exemplary embodiment may be a micro light-emitting diode, the area required to be occupied by the micro light-emitting diode is smaller and the luminous efficiency is sufficiently high. Therefore, even if the sensor device 140 is set in the pixel structure 100 and therefore compresses the size of the device disposition region S1, there is still an ideal luminous efficiency.

Figure 3:
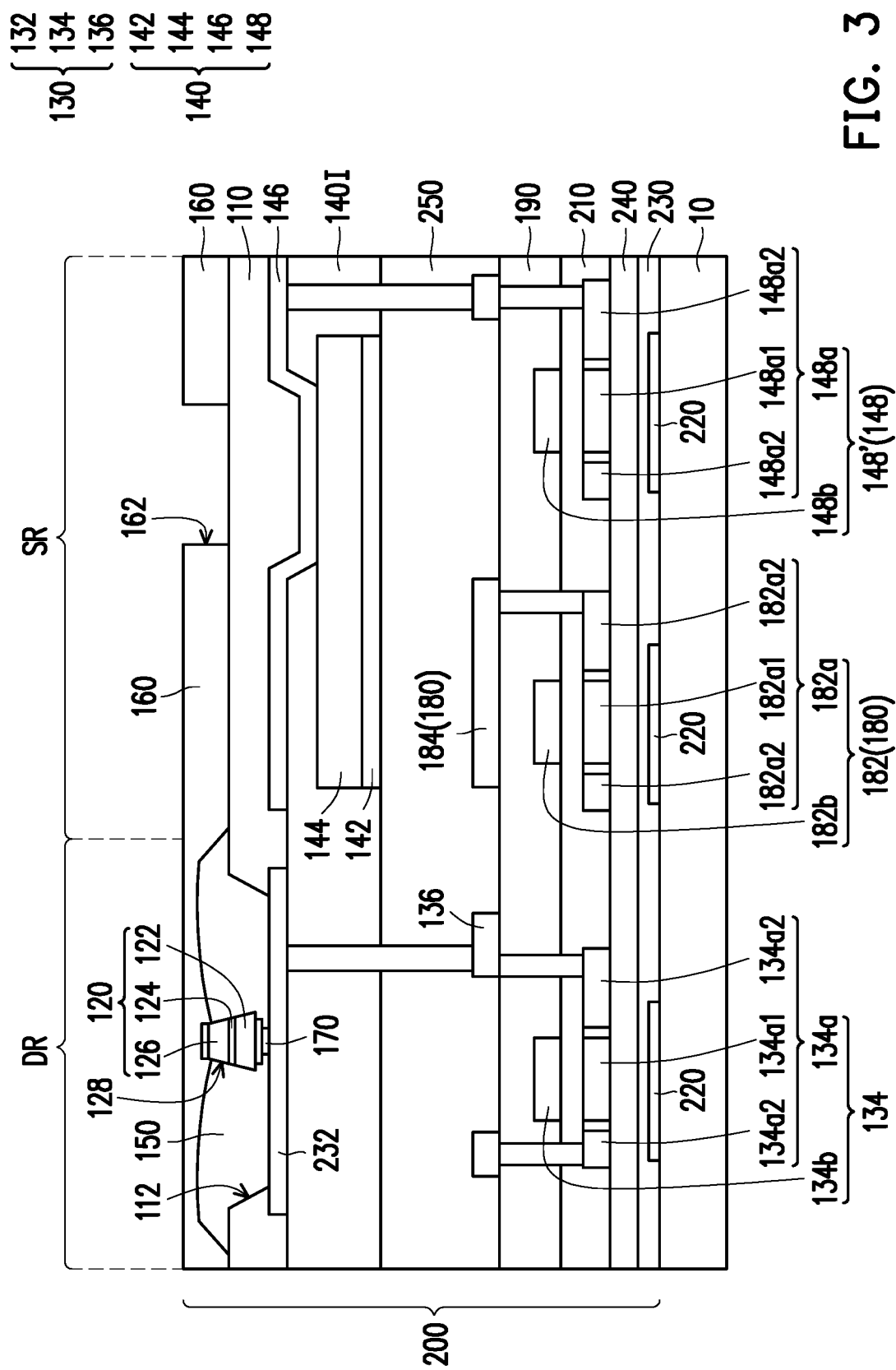
FIG. 3 is a schematic cross-sectional view of a pixel structure according to a second exemplary embodiment of the invention.

FIG. 3 is a schematic cross-sectional view of a pixel structure according to a second exemplary embodiment of the invention. Referring to FIG. 3, a pixel structure 200 is substantially similar to the pixel structure 100 of the first exemplary embodiment, and the main difference is that the pixel structure 200 further includes an insulating layer 250 disposed between the first conductive layer 142 and the insulating interlayer 190, such that the first conductive layer 142 of the sensor device 140 and the compensation circuit structure 180 may be disposed in different layers. Therefore, the compensation circuit structure 180 may be disposed in the pixel sensor region SR and located between the first conductive layer 142 of the sensor device 140 and the substrate 10.

In addition, in the exemplary embodiment, a pixel electrode 232 may not cover a side wall of the device accommodation portion 112, but only covers the bottom of the device accommodation portion 112. The pixel electrode 132 and the second conductive layer 146 of the sensor device 140 may be a same film layer, and the pixel electrode 132 and the second conductive layer 146 are formed individually after the patterning process. It should be noted that the pixel electrode 232 of the exemplary embodiment may be disposed in the disposition manner of the pixel electrode 132 as shown in FIG. 1. The pixel electrode 132 in the first exemplary embodiment may be disposed in the disposition manner of the pixel electrode 232 as shown in FIG. 3.

Figure 4:
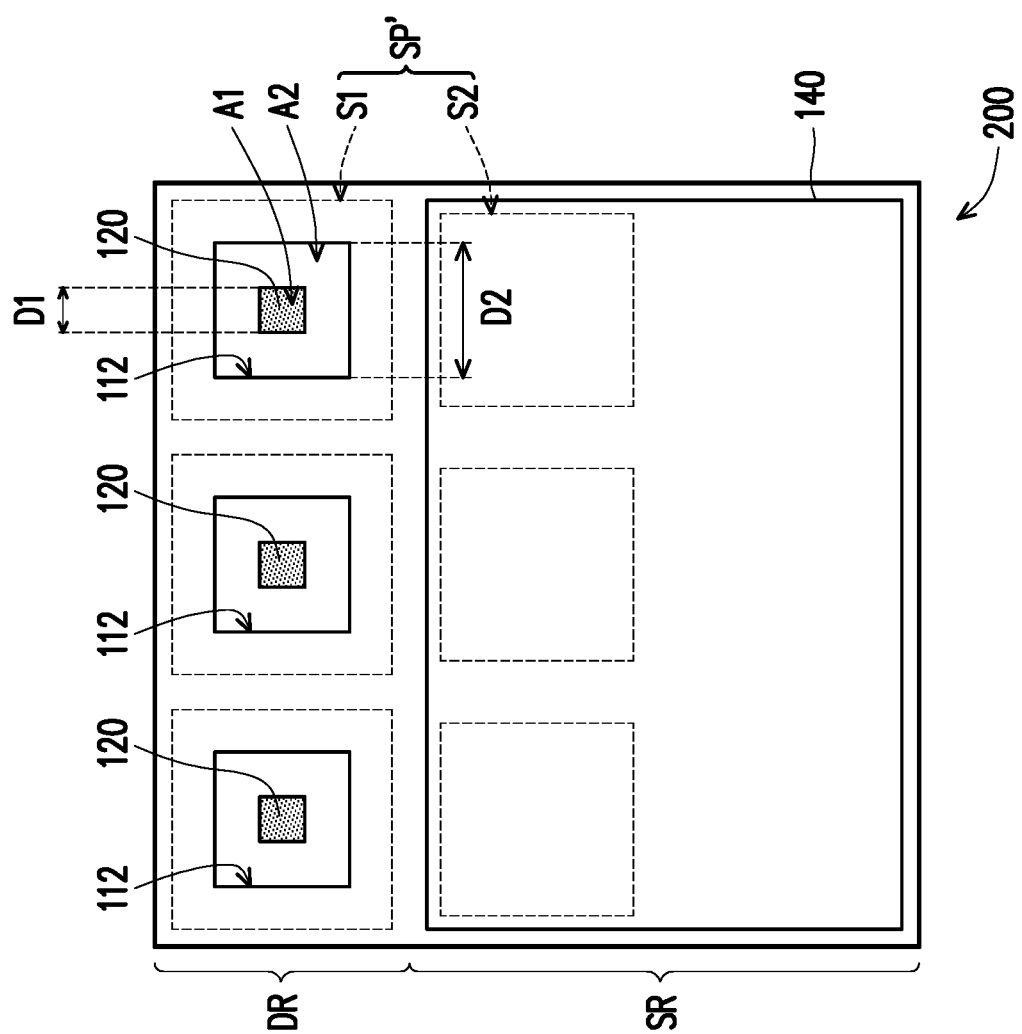
FIG. 4 is a schematic top view of the pixel structure of FIG. 3.

FIG. 4 is a schematic top view of the pixel structure of FIG. 3. Referring to FIG. 4, each of the light-emitting diodes 120 and the driving circuit thereof may form one sub-pixel SP', and the pixel structure 200 may have a plurality of sub-pixels SP' (FIG. 4 is an example of three sub-pixels SP'. In other exemplary embodiment, the number of the sub-pixels SP' may be two, four, or other numbers.). Each of the sub-pixels SP' includes a light-emitting diode 120 and a related circuit for driving the light-emitting diode 120. Each of the sub-pixels SP' may further be divided into a display device disposition region S1 (a disposition region of the light-emitting diode 120) and the compensation circuit disposition region S2 (a disposition region of the compensation circuit structure 180), wherein the display device disposition region S1 is located in the pixel display region DR, and the compensation circuit disposition region S2 is located in the pixel sensor region SR. The pixel sensor region SR for disposing the sensor device 140 corresponds to the three sub-pixels SP'. Therefore, in the pixel structure 200 of the exemplary embodiment, the number of the sensor devices 140 is not equal to the number of the sub-pixels SP' (or the light-emitting diodes 120), and the number of the sensor devices 140 is smaller than the number of the sub-pixels SP' (or the light-emitting diodes 120), but is not limited thereto. Specifically, since the pixel structure 200 of the exemplary embodiment includes the insulating layer 250, the silicon-rich material layer 144 and the compensation circuit structure 180 of the sensor device 140 may be disposed in different layers. Therefore, the compensation circuit disposition region S2 of the pixel structure 200 may be disposed in the pixel sensor region SR, and may be not similar to the compensation circuit disposition region S2 of the first exemplary embodiment disposed in the pixel display region DR (as shown in FIG. 2). In the exemplary embodiment, an area of the sensor device 140 overlaps an area of the compensation circuit structure 180. Therefore, the overall area of the pixel structure 200 is the sum of the area of the sensor device 140 and the area of the display device disposition region S1. Compared to the overall area of the pixel structure 100 of FIG. 2, the overall area of the pixel structure 200 is smaller and may be arranged with a higher density in a display apparatus of the same size to achieve a higher resolution.

Figure 5:
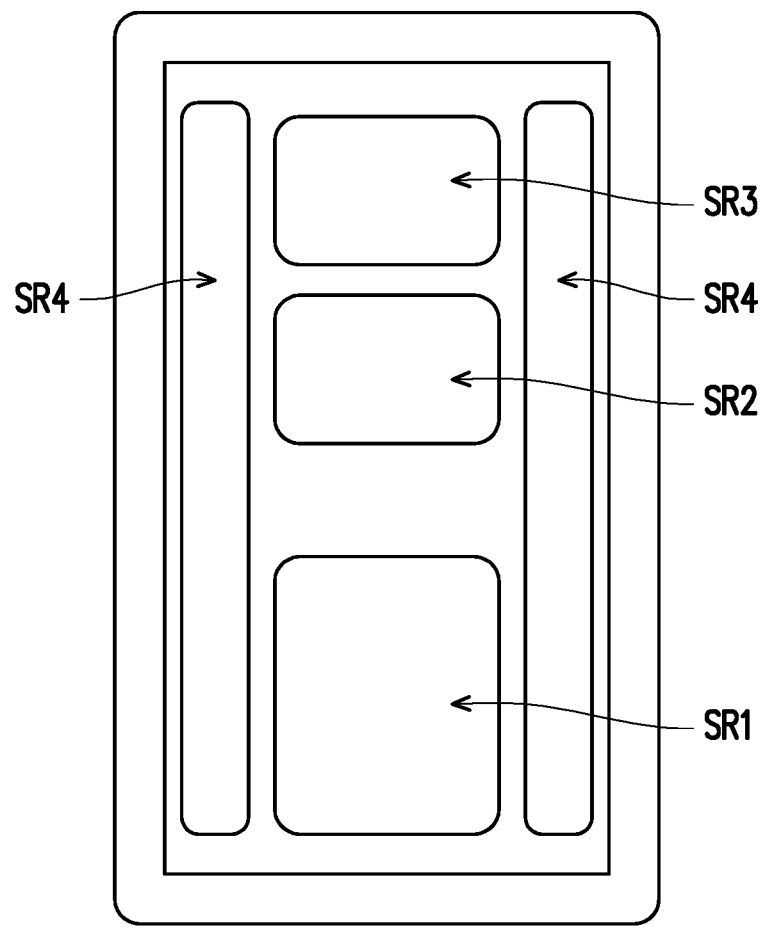
FIG. 5 is a schematic top view of a display panel according to an exemplary embodiment of the invention.

FIG. 5 is a schematic top view of a display panel according to an exemplary embodiment of the invention. Referring to FIG. 5, a display panel 1000 has a first sensor region SR1, a second sensor region SR2, a third sensor region SR3, and a fourth sensor region SR4. The first sensor region SR1, the second sensor region SR2, the third sensor region, and the fourth sensor region SR4 do not overlap one another. The display panel 1000 includes the plurality of the aforementioned pixel structures 100 of the first exemplary embodiment (or the pixel structures 200 of the second exemplary embodiment) disposed in the first sensor region SR1, the second sensor region SR2, the third sensor region SR3 and the fourth sensor region SR4. Each of the pixel structures 100 (or the pixel structures 200) includes a light-emitting diode 120 and a sensor device 140, wherein the sensor device 140 of the pixel structure 100 (or the pixel structure 200) located in the first sensor region SR1 performs a first sensing mode, the sensor device 140 of the pixel structure 100 (or the pixel structure 200) located in the second sensor region SR2 performs a second sensing mode, the sensor device 140 of the pixel structure 100 (or the pixel structure 200) located in the third sensor region SR3 performs a third sensing mode, the sensor device 140 of the pixel structure 100 (or the pixel structure 200) located in the fourth sensor region SR4 performs a fourth sensing mode. The first sensing mode, the second sensing mode, the third sensing mode and the fourth sensing mode respectively sense different parameters, wherein the first sensing mode may perform one of fingerprint recognition, visible light sensing, ultraviolet light sensing, and infrared light sensing, the second sensing mode may perform another, the third sensing mode and the fourth sensing mode may perform one of the remaining two, respectively. To provide an example, the first sensing mode may perform the fingerprint recognition, the second sensing mode may perform the UV light sensing, the third sensing mode may perform the infrared light sensing, and the fourth sensing mode may perform the visible light sensing, but the invention is not limited thereto.

It should be noted that the number of sensor regions mentioned herein and the sensing modes performed by the sensor regions are only examples, and are not intended to limit the invention. In other exemplary embodiment, the number of sensor regions may be one, two, or any other number. In addition, sensing modes performed by different sensor regions may be the same or may not be the same.

In light of the foregoing, the pixel structure of the invention includes the pixel defining layer, the light-emitting diode, the pixel driving circuit and the sensor device. The light-emitting diode is disposed in the device accommodation portion of the pixel defining layer, wherein the area of the light-emitting diode is smaller than that of the device accommodation portion. In other words, the area occupied by the light-emitting diode is smaller. Therefore, even if the sensor device is set in the pixel structure and thereof compresses the size of the pixel display region, the luminous efficiency of the pixel structure is not affected. Since the display panel of the invention includes the aforementioned pixel structure, the luminous efficiency thereof is also less affected by the size of the pixel display region.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A pixel structure, disposed on a substrate, wherein the substrate has a pixel sensor region and a pixel display region, and the pixel display region is disposed beside the pixel sensor region, the pixel structure comprising:
    a pixel defining layer, disposed on the substrate, wherein the pixel defining layer has a device accommodation portion, and the device accommodation portion is located in the pixel display region;
    a light-emitting diode, disposed on the device accommodation portion, wherein an area of the light-emitting diode is smaller than an area of the device accommodation portion;
    a pixel driving circuit, disposed on the substrate, wherein the pixel driving circuit is electrically connected to the light-emitting diode, the pixel driving circuit comprises a pixel electrode, the pixel electrode covers the device accommodation portion, and the light-emitting diode is bonded onto the pixel electrode; and
    a sensor device, disposed between the pixel defining layer and the substrate, wherein the sensor device is located in the pixel sensor region, and the sensor device comprises a first conductive layer and a sensing driving circuit electrically connected to the first conductive layer,
    wherein the sensing driving circuit comprises a sensor active device, the sensor active device is located in the pixel sensor region and comprises a semiconductor layer and a gate, the semiconductor layer has a channel region, a drain region and a source region, the drain region the source region are located on opposite sides of the channel region, and the channel region is located between the gate and the substrate.

2. The pixel structure according to claim 1, wherein the pixel driving circuit further comprises a pixel active device, and the pixel active device is disposed between the pixel electrode and the substrate and is electrically connected to the pixel electrode.

3. The pixel structure according to claim 2, further comprising a protective layer covering the pixel electrode and the device accommodation portion and surrounding the light-emitting diode.

4. The pixel structure according to claim 3, further comprising a counter electrode electrically connected to the light-emitting diode, wherein the counter electrode and the pixel electrode are connected to two opposite sides of the light-emitting diode and are isolated from each other by the protective layer.

5. The pixel structure according to claim 4, wherein the counter electrode has an opening, and the opening is located in the pixel sensor region.

6. The pixel structure according to claim 1, wherein the sensor device further comprises a silicon-rich material layer and a second conductive layer that are stacked in sequence.

7. The pixel structure according to claim 6, further comprising a compensation circuit structure electrically connected to the pixel driving circuit and located in the pixel sensor region, wherein the compensation circuit structure is located between the silicon-rich material layer and the substrate.

8. The pixel structure according to claim 1, wherein the pixel driving circuit further comprises a pixel active device, the pixel active device is located in the pixel display region and comprises a semiconductor layer and a gate, the semiconductor layer has a channel region, a drain region and a source region, the drain region and the source region are located on opposite sides of the channel region, and the channel region is located between the gate and the substrate, wherein the channel region of the pixel active device and the channel region of the sensor active device are a same film layer, and the gate of the pixel active device and the gate of the sensor active device are a same film layer.

9. The pixel structure according to claim 6, further comprising an insulating interlayer disposed between the substrate and the pixel defining layer, wherein the pixel driving circuit further comprises a pixel active device and a conductive connecting layer, the pixel active device is located between the insulating interlayer and the substrate, the conductive connecting layer is disposed on the insulating interlayer to connect between the pixel active device and the pixel electrode, and the conductive connecting layer and the first conductive layer of the sensor device are a same film layer.

10. The pixel structure according to claim 6, wherein the pixel electrode and the second conductive layer of the sensor device are a same film layer.

11. The pixel structure according to claim 1, wherein the light-emitting diode comprises a first semiconductor layer, an inorganic light-emitting layer and a second semiconductor layer that are stacked in sequence.

12. The pixel structure according to claim 1, wherein the light-emitting diode is bonded onto the pixel electrode of the pixel driving circuit by a conductive bonding layer.

13. The pixel structure according to claim 1, wherein a ratio of a width of the light-emitting diode to a width of the device accommodation portion is smaller than or equal to 1, and greater than or equal to 0.01.

14. A display panel, having a first sensor region and a second sensor region, the display panel comprising a plurality of pixel structures disposed in the first sensor region and the second sensor region, and each of the pixel structures comprising a light-emitting diode and a sensor device, wherein:
    the sensor device of the pixel structure located in the first sensor region performs a first sensing mode, the sensor device of the pixel structure located in the second sensor region performs a second sensing mode, and the first sensing mode and the second sensing mode sense different parameters.

15. The display panel according to claim 14, wherein the first sensing mode performs one of fingerprint recognition, visible light sensing, ultraviolet light sensing and infrared light sensing, and the second sensing mode performs another.

16. The display panel according to claim 14, wherein the first sensor region and the second sensor region do not overlap each other.

17. The display panel according to claim 14, wherein each of the pixel structures is disposed on the substrate, the substrate has a pixel sensor region and a pixel display region beside the pixel sensor region, and each of the pixel structures further comprises:
    a pixel defining layer, disposed on the substrate, wherein the pixel defining layer has a device accommodation portion, and the device accommodation portion is located in the pixel display region; and
    a pixel driving circuit, disposed on the substrate and electrically connected to the light-emitting diode, wherein the pixel driving circuit comprises a pixel electrode, and the pixel electrode covers the device accommodation portion, wherein the light-emitting diode is disposed on the device accommodation portion and is bonded onto the pixel electrode, an area of the light-emitting diode is smaller than an area of the device accommodation portion, the sensor device is disposed between the pixel defining layer and the substrate, and the sensor device is located in the pixel sensor region.

18. The display panel according to claim 17, wherein the sensor device comprises a first conductive layer, a silicon-rich material layer and a second conductive layer that are stacked in sequence.

\* \* \* \* \*

UNITED STATES PATENT AND TRADEMARK OFFICE
CERTIFICATE OF CORRECTION

PATENT NO. : 10,727,286 B2  
APPLICATION NO. : 15/956769  
DATED : July 28, 2020  
INVENTOR(S) : Che-Chia Chang et al.

Page 1 of 1

It is certified that error appears in the above-identified patent and that said Letters Patent is hereby corrected as shown below:

On the Title Page

Insert:  
--(30) Foreign Application Priority Data  
December 21, 2017 (TW) ...................106145143--

Signed and Sealed this  
Twenty-fifth Day of May, 2021

Drew Hirshfeld  
*Performing the Functions and Duties of the*  
*Under Secretary of Commerce for Intellectual Property and*  
*Director of the United States Patent and Trademark Office*